United States Patent [19]
Rolfson

[11] Patent Number: 5,376,483
[45] Date of Patent: Dec. 27, 1994

[54] METHOD OF MAKING MASKS FOR PHASE SHIFTING LITHOGRAPHY

[75] Inventor: J. Brett Rolfson, Boise, Id.

[73] Assignee: Micron Semiconductor, Inc., Boise, Id.

[21] Appl. No.: 133,633

[22] Filed: Oct. 7, 1993

[51] Int. Cl.$^5$ .................................................. G03F 9/00
[52] U.S. Cl. ...................................... 430/5; 430/312; 430/313; 430/314; 430/394
[58] Field of Search .................... 430/5, 312, 313, 314, 430/318, 319, 320, 321, 328, 330, 394, 396

[56] References Cited

U.S. PATENT DOCUMENTS

| | | |
|---|---|---|
| 5,045,417 | 9/1991 | Okamoto ................................ 430/5 |
| 5,079,113 | 1/1992 | Ohta et al. ............................ 430/5 |
| 5,126,220 | 6/1992 | Tokitomo et al. .................... 430/5 |
| 5,153,083 | 10/1992 | Garofalo et al. ..................... 430/5 |
| 5,194,344 | 3/1993 | Cathey, Jr. ........................... 430/5 |
| 5,194,345 | 3/1993 | Rolfson ................................ 430/5 |
| 5,194,346 | 3/1993 | Rolfson et al. ...................... 430/5 |
| 5,208,125 | 5/1993 | Lowrey et al. ....................... 430/5 |
| 5,217,830 | 6/1993 | Lowrey ................................ 430/5 |
| 5,240,796 | 8/1993 | Lee et al. ............................. 430/5 |
| 5,292,623 | 3/1994 | Kemp et al. .......................... 430/5 |

FOREIGN PATENT DOCUMENTS 3-172845 7/1991 Japan .

Primary Examiner—Steve Rosasco
Attorney, Agent, or Firm—Stephen A. Gratton

[57] ABSTRACT

An improved method of fabricating phase shifting masks for semiconductor manufacture includes protecting an opaque layer of the mask during the mask fabrication process with a toughened layer of resist. For forming a Levenson phase shifting mask, an opaque layer is deposited on a transparent substrate. The opaque layer is then patterned using a layer of resist. This layer of resist is toughened and de-sensitized to subsequent patterning and intermediate processing. A phase layer of resist is then deposited on the toughened layer of resist and patterned for etching phase shifting areas in the substrate. During the etching process the opaque layer is protected by the toughened layer of resist. Etching of the phase shifting areas on the substrate can be in stages using a voting technique.

18 Claims, 3 Drawing Sheets

METHOD OF MAKING MASKS FOR PHASE SHIFTING LITHOGRAPHY

FIELD OF THE INVENTION

This invention relates to optical lithography and more particularly to the fabrication of masks or reticles which are used in optical lithography. The method of the invention is particularly suited to the fabrication of phase shifting masks for semiconductor manufacture.

BACKGROUND OF THE INVENTION

In semiconductor manufacture, microlithography is used in the formation of integrated circuits on a semiconductor wafer. During a lithographic process, a form of radiant energy such as ultraviolet light, is passed through a mask or reticle and onto the semiconductor wafer. The mask contains opaque and transparent regions formed in a predetermined pattern. A grating pattern, for example, my be used to define parallel spaced conducting lines on a semiconductor wafer. The ultraviolet light exposes the mask pattern on a layer of resist formed on the wafer. The resist is then developed for removing either the exposed portions of resist for a positive resist or the unexposed portions of resist for a negative resist. The patterned resist can then be used during a subsequent semiconductor fabrication process such as ion implantation or etching.

As microcircuit densities have increased, the size of the features of semiconductor devices have decreased to the submicron level. These submicron features my include the width and spacing of metal conducting lines or the size of various geometric features of active semiconductor devices. The requirement of submicron features in semiconductor manufacture has necessitated the development of improved lithographic processes and systems. One such improved lithographic process is known as phase shift lithography.

With phase shift lithography the interference of light rays is used to overcome diffraction and improve the resolution and depth of optical images projected onto a target. In phase shift lithography, the phase of an exposure light at the object is controlled such that adjacent bright areas are formed preferably 180 degrees out of phase with one another. Dark regions are thus produced between the bright areas by destructive interference even when diffraction would otherwise cause these areas to be lit. This technique improves total resolution at the object and allows resolutions as fine as 0.25 $\mu$m to occur.

In general, a phase shift mask is constructed with a repetitive pattern formed of three distinct layers of material. An opaque layer provides areas that allow no light transmission, a transparent layer provides areas which allow close to 100% of light to pass through and a phase shifter layer provides areas which allow close to 100% of light to pass through but phase shifted 180 degrees from the light passing through the transparent areas. The transparent areas and phase shifting areas are situated such that light rays diffracted through each area is canceled out in a darkened area therebetween. This creates the pattern of dark and bright areas which can be used to clearly delineate features of a pattern defined by the opaque layer on a photopatterned semiconductor wafer.

Recently, different techniques have been developed in the art for fabricating different types of phase shifting masks. One type of phase shifting mask, named after the pioneer researcher in the field, M. D. Levenson, is known in the art as a "Levenson" phase shift mask. Such a mask be formed on a transparent quartz substrate or the like. An opaque layer, formed of a material such as chromium, is deposited on the quartz substrate in a pattern which carries the desired pattern. Phase shifting areas on the mask may be formed by depositing a phase shifting material over the opaque layer or by forming areas of the quartz substrate with a decreased thickness.

A representative process for forming a Levenson phase shift mask is shown in FIGS. 1A–1D. In FIG. 1A, a transparent quartz substrate 10 has a film of an opaque material 12 such as chromium (CR) deposited thereon. The opaque material 12 ray be deposited on the quartz substrate 10 using a suitable deposition process such as sputtering, chemical vapor deposition (CVD) or electron beam deposition (EBD).

Next, and as shown in FIG. 1B, photoresist is deposited and developed to produce a patterned layer of resist 14. The opaque material 12 is then etched through the layer of resist 14 forming a repetitive pattern of openings 16 through the opaque material 12. The quartz substrate 10 under every other one of these openings 16 will eventually become the light transmission areas 22 on the finished mask. The quartz substrate 10, under the other half of the openings 16 in an alternating pattern, is etched to a reduced thickness to produce the phase shifting areas 20 on the finished mask 26 (FIG. 1E).

Following formation of the openings 16, the layer of resist 14 is stripped. Next, and as shown in FIG. 1C, a second layer of resist 18 is deposited over the opaque material 12. This second layer of resist is sometimes referred to as the "phase layer". The second layer of resist 18 must be realigned with the pattern of the initially formed openings 16, such that half of the openings 16' are exposed and half of the openings 16" are covered with resist. This defines the alternating pattern of opaque light blockers 24, light transmission areas 22, and phase shifting areas 20 on the quartz substrate 10 in the finished mask 26 (FIG. 1E).

Accordingly, and as shown in FIG. 1D, the quartz substrate 10 is etched through the exposed openings 16' to form the phase shifting areas 20. After stripping of the second layer of resist 18, and as shown in FIG. 1E, the finished mask 26 includes a repetitive pattern of opaque light blockers 24, phase shifting areas 20 and light transmission areas 22.

The phase shifting areas 20 of the quartz substrate 10 have a reduced thickness. When the finished mask is used in a lithography process, the light passing through a phase shifting area 20 is shifted in phase relative to light passing through an adjacent light transmission area 22, which must travel through the full thickness of the quartz substrate 10. In the finished mask each phase shifting area 20 preferably has a thickness that produces a 180° ($\pi$) phase shift for light passing therethrough relative to light passing through the light transmission areas 22. This process for forming a Levenson phase shift mask 26 is sometimes referred to as a subtractive process, because substrate material is removed to form the phase shifting areas 20.

A problem with this method of forming a phase shifting mask 26 is that it is difficult to realign the second layer of resist 18 (FIG. 1C) with the openings 16 (FIG. 1B) initially formed in the layer of opaque material 12. For that reason, and as shown in FIG. 1C, the pattern of openings 16' in the second layer of resist 18 must be oversized. This helps to compensate for registration tolerances. Typically, these registration tolerances for the second layer of resist 18 will be on the order of ±0.35 to 0.50 μm.

With the oversized second layer of resist 18, the corner portions 28 (FIG. 1C) of the opaque material 12 are left exposed. When the openings 16' are subsequently etched to form the phase shifting areas 20 (FIG. 1E), the corner portions 28 may also be etched to form notched portions 30 (FIG. 1D) on the opaque material 12.

Etching of the phase shifting areas 20 is typically accomplished using a dry plasma etch process such as reactive ion etching (RIE). Such an etching process combines plasma and ion beams along with low pressures to physically and chemically remove the quartz material. Such an etch process, however, has been known to etch the exposed corner portions 28 of the layer of opaque material 12 and re-deposit this material in unwanted areas of the substrate 10. This material redeposition may be due to the low vapor pressure of the by-products and the physical sputtering of the opaque material 12. The redeposited material may thus cause unwanted optical effects in the finished mask 26.

In view of these and other problems, there is a need in the art for improved methods of making masks for phase shifting lithography. Accordingly, it is an object of the present invention to provide an improved method of making phase shifting masks for lithography. It is a further object of the present invention to provide an improved method of making phase shifting masks in which an opaque layer of the mask is protected during an etching step of the fabrication process to prevent redeposition of the opaque material. It is yet another object of the present invention to provide an improved method of making masks for phase shifting lithography that is efficient, inexpensive and adaptable to large scale semiconductor manufacture. It is a still further object of the present invention to provide an improved method of making phase shifting masks that is compatible with different mask making techniques, such as a "voting" technique, wherein phase shifting areas are etched a multiple of times.

SUMMARY OF THE INVENTION

In accordance with the present invention an improved method of fabricating phase shifting masks or reticles suitable for semiconductor photolithography is provided. In an illustrative embodiment, the method of the invention is utilized in the formation of a subtractive Levenson phase shift mask. The method of the invention uses an initially deposited layer of resist to form openings through an opaque layer formed on a transparent substrate. This initially deposited layer of resist is then toughened and de-sensitized and a second layer of resist is deposited on the toughened layer as a phase layer. The phase layer of resist is utilized in the etching of phase shifting areas on the transparent substrate. During this etching step, the opaque layer is protected from etching and redeposition by the toughened layer of resist. The etch depth into the substrate will control the amount of phase shift achieved. Typically the amount of phase shift will be 180° or an odd multiple thereof (i.e. ($\pi$) or odd multiple thereof). Following etching of the phase shifting areas the toughened layer of resist and the phase layer of resist are both stripped away.

A subtractive Levenson phase shifting mask formed with the method of the invention includes a pattern of opaque light blockers on the transparent substrate, with each light blocker having a phase shifting area and a light transmission area on either side. In general, the method of the invention can be used whenever it is necessary to protect an opaque layer of the mask during subsequent intermediate processing steps such as the etching of phase shifting areas.

In addition, the method of the invention can be used with a "voting" or "voted" technique of etching wherein the phase shifting areas of the transparent substrate are etched multiple times to intermediate depths and then to the final depth. These intermediate depths will typically be at some fraction of the total desired phase shift (e.g. $\pi/2$, $\pi/3$).

Such a voting technique can be done in numerous ways. In one approach the transparent substrate is etched to an intermediate depth. The transparent substrate is then cleaned with a solution that will not attack either the toughened layer of resist or the phase layer of resist. This removes unwanted contamination from the partially etched mask. This etch and clean process can be repeated until the required etch depth is reached.

With another voting technique, following etching of the transparent substrate to an intermediate depth, the phase layer of resist can be removed while the toughened layer of resist is left in place. New phase layers of resist can then be redeposited and realigned for etching to deeper intermediate depths or to the final depth. The toughened layer of resist thus protects the opaque layer during the staged etching process.

Other objects, advantages and capabilities of the present invention will become more apparent as the description proceeds.

DETAILED DESCRIPTION OF THE PREFERRED EMBODIMENT

Figures 1A, 1B, 1C, 1D, 1E:
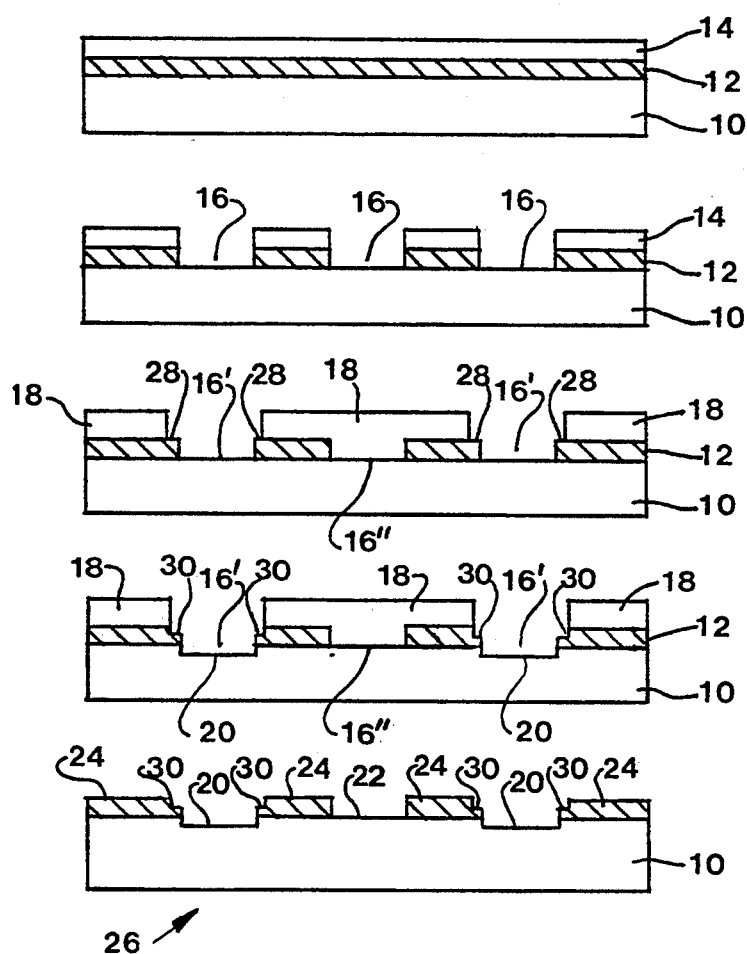
FIGS. 1A-1E are diagrammatic representations of a prior art process for forming a subtractive Levenson phase shifting mask.
Figure 2A:
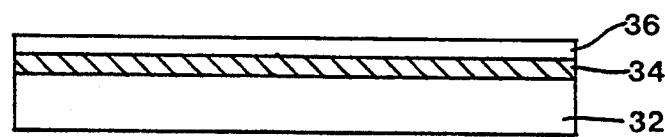
FIGS. 2A-2F are diagrammatic representations of a process for forming a subtractive Levenson phase shifting mask in accordance with the method of the invention.

Referring now to FIGS. 2A-2E, the method of the invention is shown in the fabrication of a subtractive Levenson phase shifting mask. As shown in FIG. 2A, a transparent substrate 32 for the phase shifting mask includes an opaque layer 34 deposited thereon. In an illustrative embodiment of the invention, the transparent substrate 32 is formed of polished quartz. Quartz is typically utilized as the mask substrate material in optical lithographic systems and is transparent in the UV region. Alternately, the transparent substrate 32 may be formed of any other transparent material having suitable optical and mechanical properties.

The opaque layer 34, on the other hand, is formed of a material that is opaque to wavelengths in the UV and deep UV regions. The opaque layer 34 must also be formed of a material that is suitable for deposition as a thin film. Suitable materials include chromium, iron oxide, aluminum and polysilicon or amorphous silicon. The opaque layer 34 may be deposited on the transparent substrate 32 by conventional processes such as sputtering, chemical vapor deposition (CVD), or electron beam deposition (EBD).

Next, a photolithographic process is used to pattern the opaque layer 34 in a pattern which will ultimately be transferred onto a semiconductor wafer. As an example, the pattern may comprise a dense line-space pattern such as a simple grating pattern for defining parallel spaced conducting lines on a semiconductor wafer. Depending on the semiconductor structure required, other dense line-space patterns such as grids, and other complex patterns required in integrated circuit manufacturing. In the photolithographic process, a layer of resist 36 is coated and written on the opaque layer 34. Writing may be by techniques known in the art, such as with E-beam writing or laser pattern writing.

Figure 2B:
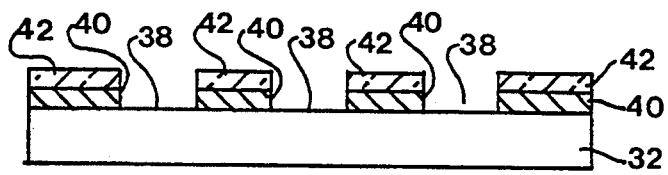

Next, and as shown in FIG. 2B, an etch and strip step of the photolithographic process forms a pattern of openings 38 and opaque light blockers 40. The openings 38 will be used to form an alternating pattern of phase shifting areas and light transmission areas on the transparent substrate 32.

with prior art methods for forming a phase shifting reticle, such as the process shown in FIGS. 1A–1E, the layer of resist 36 would be removed following patterning of the opaque layer with the process of the present invention, however, the layer of resist 36 is not removed but is treated to form a toughened or de-sensitized layer of resist 42. The toughened layer of resist 42 can be formed either before or after etching of the opaque layer 34.

In general, the toughened layer of resist 42 is "de-sensitized" and is thus not exposed nor developed in subsequent writes. In addition, the toughened layer of resist 42 must be tough enough to be unaffected by subsequent processing steps. For example, if a voting technique is used to etch the transparent substrate 32, the toughened layer of resist 42 must be sufficiently tough to resist the weak strip process for removing subsequent layers of resist. The layer of resist 36 can be toughened or de-sensitized by techniques that are known in the art. Acceptable methods of toughening or desensitizing the layer of resist 36 include:

Plasma or reactive ion etching (RIE).

Oven baking at a temperature sufficient to de-sensitize the resist (e.g., 140°–160° C. for DNQ resists).

UV stabilization using techniques known in the art (e.g. flood expose with UV light and then bake at an elevated temperature of approximately 180° C.).

Figure 2C:
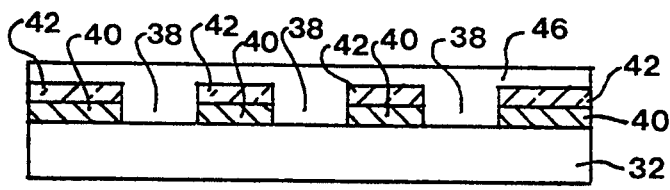

Next, and as shown in FIG. 2C, a second or phase layer of resist 46 is deposited over the toughened layer of resist 42 and into the openings 38. This phase layer of resist 46 can be deposited and patterned using techniques that are known in the art. If an E-beam maskwriter is used to pattern the phase layer of resist 46, an anti-static layer (not shown) may optionally be applied to the phase layer of resist 46.

Figure 2D:
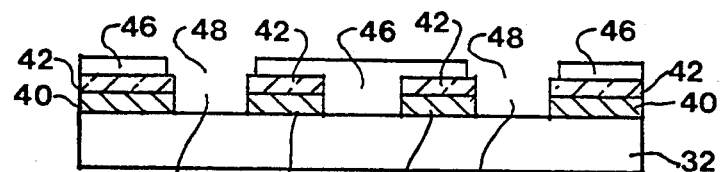

After etching of the phase layer of resist 46 and as shown in FIG. 2D, openings 48 are formed. The openings 48 are aligned with every other opening 38 previously formed through the opaque light blockers 40 to the substrate 32. As with the previously formed openings 38, the new openings 48 can be formed as elongated trenches. The new openings 48, however, are oversized with respect to the previously formed openings 38. This is to help to compensate for registration tolerances. As previously stated, these registration tolerances will be on the order of ±0.35 to 0.50 $\mu$m.

Figure 2E:
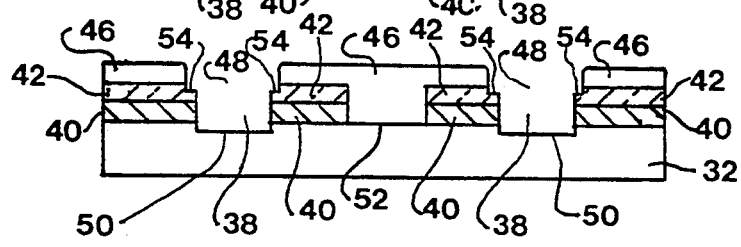

Next, and as shown in FIG. 2E, the quartz substrate 32 is etched through the openings 38, 48 to form phase shifting areas 50 on the transparent substrate 32. The phase shifting areas 50 have a reduced thickness with respect to the remainder of the transparent substrate 32. During a photolithographic process, light passing through a phase shifting area 50 and exiting from the transparent substrate 32 will be out of phase with light exiting an adjacent light transmission area 52. The thickness of the phase shifting areas 50 is preferably selected to achieve a 180° ($\pi$) phase shift or odd multiple thereof.

The phase shifting areas 50 can be etched using a plasma dry etch. Such a dry etch can be performed in an ion reactor using an etching gas, such as a $CHF_3/O_2$ mixture introduced at a low pressure into the etch chamber. The amount and energy of the etching ions are controlled by the reactor's RF power and gap. Such an etch for forming the phase shifting areas 50 is very similar to those used in the art for anisotropic $SiO_2$ etching. In some cases, isotropic etching could also be used. In addition, etching could be performed using MERIE (Magnetically Enhanced Reactive Ion Etching).

During the plasma dry etch, the opaque light blockers 40 are protected by the toughened layer of resist 42. There is thus no possibility of the opaque material being etched from the opaque light blockers 40 and redeposited in an unwanted area of the finished mask. A corner portion 54 of the toughened layer of resist 42 may be slightly eroded during the dry etch process. Since the resist is formulated of an organic material, however, it will typically be consumed by the plasma etch and will not be redeposited.

Figure 2F:
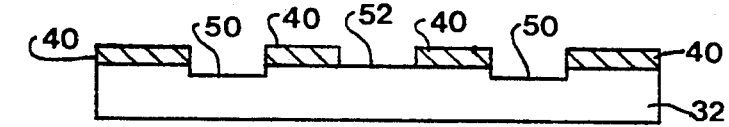

Next, and as shown in FIG. 2F, an aggressive strip technique can be used to strip both the toughened layer of resist 42 and the phase layer of resist 46. Such an aggressive resist strip could typically be performed with an acid and a strong oxidant (e.g., $H_2SO_4$ and $H_2O_2$). Commercially available aggressive strippers are also known in the art. As an example, an aggressive organic stripper such as ACSI (Milpitas) ST-22 could be utilized.

This forms a phase shifting mask 56 that includes a pattern of opaque light blockers 40 each having a phase shifting area 50 on one side and a light transmission area 52 on the other side. This repetitive pattern can be described as opaque light blocker 40, phase shifting area 50, opaque light blocker 40, light transmission area 52. The width of the opaque light blockers 40, phase shifting areas 50 and light transmission areas 52 can be selected as required.

VOTING TECHNIQUE

Figure 3E:
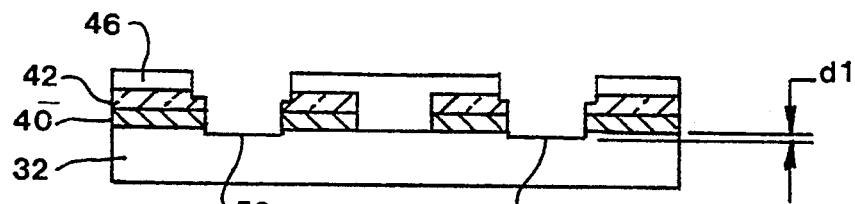
FIGS. 3E-3G are diagrammatic representations of a process for forming a subtractive Levenson phase shifting mask in accordance with the method of the invention and using a voting technique of etching.
Figure 3F:
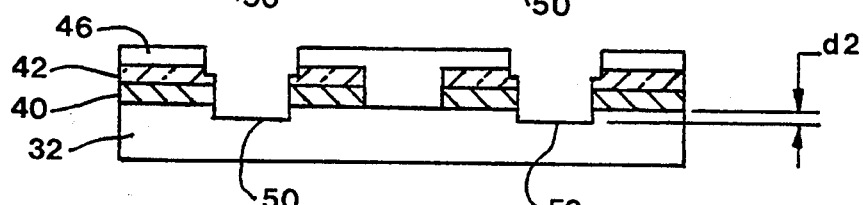
Figure 3G:
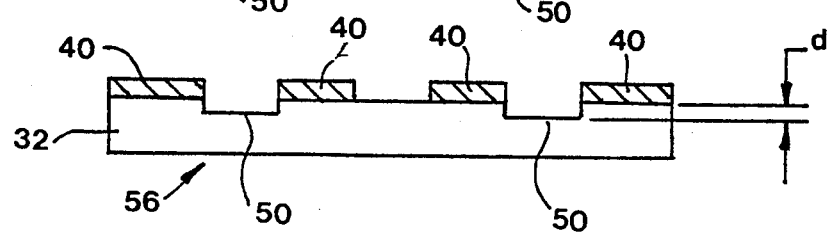
Figure 4E:
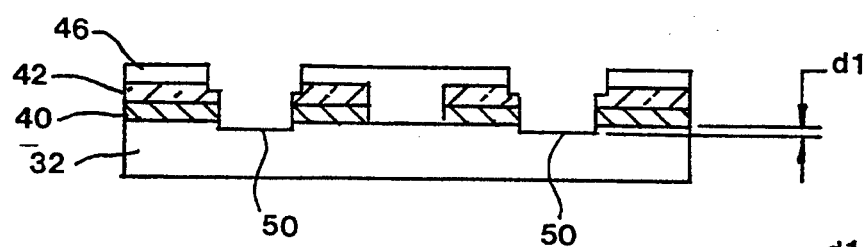
FIGS. 4E-4G are diagrammatic representations of a process for forming a subtractive Levenson phase shifting mask in accordance with the method of the invention and using a voting technique of etching.
Figure 4F:
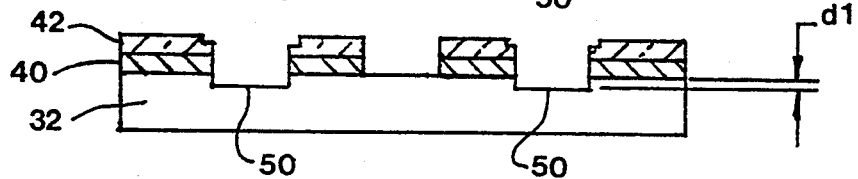
Figure 4G:
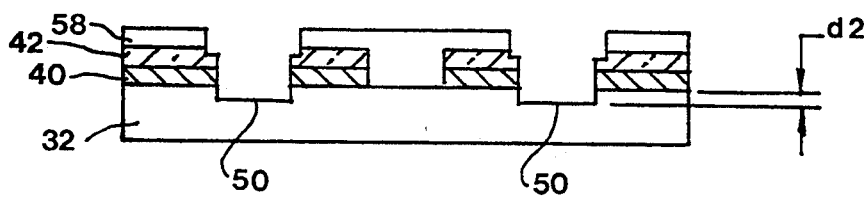

The method of the invention can also be used with a voting or voted technique of etching. With a voting technique the phase shifting areas are formed by etching the transparent substrate in stages to various intermediate depths and then to a final depth. This allows better process controls and a higher quality etched surface. The intermediate etch depths are typically a fraction of the total desired phase shift. For example, if a total phase shift of 180° ($\pi$) is desired, the intermediate depths can located at a depth equivalent to a fraction of 180° (e.g. $\pi/3$, $\pi/4$). FIGS. 3E–3G illustrate one approach for using a voting technique and FIGS. 4E–4G illustrate a different approach.

In FIG. 3E, the transparent substrate 32 includes the opaque light blockers 40 covered by the toughened layer of resist 42 and the phase layer of resist 46. This structure is formed exactly as shown in FIGS. 2A–2E and as previously explained with a voting technique, however, the phase shifting areas 50 are etched using a plasma dry etch to an intermediate depth d1. As an example, if a phase shift of pi is desired the intermediate depth may be at $\pi/3$ or $\pi/4$. The transparent substrate 32 is then cleaned by rinsing with a solution that does not attack the toughened layer of resist 42 or the phase layer of resist 44. This removes unwanted contaminants from the etching process. Suitable solutions for rinsing a quartz substrate include dionized (DI) water and isopropyl alcohol. Mixtures of these solutions with one another and with liquid $NH_4OH$ are also suitable. In general, any solution suitable for cleaning the etched phase shifting areas 50 without attacking the toughened layer of resist 42 or the phase layer of resist 46 could be used.

Following this cleaning, and as shown in FIG. 3F, the phase shifting areas 50 are etched to another intermediate depth of d2. As before etching can be with a plasma dry etch process.

This process of etching and cleaning can be repeated to a final depth d (FIG. 3G) which is selected for achieving a desired phase shift (e.g. $\pi$ or odd multiple thereof). During this etching process, the opaque light blockers 40 are protected by the toughened layer of resist 42. This prevents contamination of the substrate 32 with redeposited opaque material.

Referring now to FIGS. 4E–4G the method of the invention is shown using another voting technique for etching the phase shifting areas 50. A voting technique of etching can also be performed by etching, cleaning and then stripping away the phase layer of resist 46. A new phase layer of resist 58 is then redeposited and re-aligned for each intermediate etching stage.

In FIG. 4E, the transparent substrate 32 includes the opaque light blockers 40 covered by the toughened layer of resist 42 and the phase layer of resist 46. This structure is formed exactly as shown in FIGS. 2A–2E and as previously explained. The phase shifting areas 50, however, have been etched to an intermediate etch depth d1.

Next, as shown in FIG. 4F, the substrate 32 is cleaned and the phase layer of resist 44 is removed. The toughened layer of resist 42 is left in place for protecting the opaque light blockers 40 during this cleaning and stripping process. This can be accomplished by stripping the phase layer of resist 46 with a relatively weak stripper that will not affect the toughened layer of resist 42. As an example, a weak solvent such as N-Butyl Acetate (NBA) could be used. Such weak strippers are known in the art especially for stripping resist (on wafers) from partially cured polyimide protective coatings.

Next, as shown in FIG. 4G, a new phase layer of resist 58 is deposited aligned and written in the same pattern as the original phase layer of resist 46. This re-coating and re-aligning of another phase layer can be done using known techniques and suitable equipment such as a maskwriter. In this etch stage the phase shifting areas 50 are etched to a depth of d2. This may be an intermediate depth or the final depth for achieving a desired phase shift. This process of stripping the phase layer of resist and recoating with a new phase layer of resist can be repeated for each stage of the etching process. During such a staged etching process the opaque light blockers 40 are protected by the toughened layer of resist 42.

While the process of the invention has been described with reference to a preferred embodiment thereof, as will be apparent to those skilled in the art, certain changes and modifications can be made without departing from the scope of the invention as defined by the following claims:

What is claimed is:

1. A method of forming a phase shifting mask comprising:
   depositing an opaque layer on a transparent substrate;
   depositing a first layer of resist on the opaque layer;
   transferring a predetermined pattern onto the opaque layer using the first layer of resist;
   toughening and desensitizing the first layer of resist so that the first layer of resist is substantially unaffected by subsequent processing steps;
   depositing a second layer of resist on the toughened first layer of resist;
   forming phase shifting areas on the substrate using the second layer of resist while the opaque layer is protected by the toughened first layer of resist; and
   stripping the toughened first layer of resist and the second layer of resist.

2. The method of forming a phase shifting mask as claimed in claim 1 and wherein the phase shifting areas are formed by etching the transparent substrate.

3. The method of forming a phase shifting mask as claimed in claim 2 and wherein the second layer of resist includes openings aligned with openings in the toughened first layer of resist for forming the phase shifting areas.

4. The method of forming a phase shifting mask as claimed in claim 3 and wherein the phase shifting areas are etched in stages.

5. The method of forming a phase shifting mask as claimed in claim 4 and wherein the second layer of resist is stripped after each etch stage and another layer of resist is deposited and realigned with the toughened first layer of resist.

6. The method of forming a phase shifting mask as claimed in claim 1 and wherein a Levenson phase shifting mask is formed.

7. The method of forming a phase shifting mask as claimed in claim 1 and wherein the second layer of resist is stripped without substantial attack of the toughened first layer of resist for performing a voting technique of etching for forming the phase shifting areas.

8. A method of forming a phase shifting mask comprising:
   depositing an opaque layer on a transparent substrate;
   depositing a first layer of resist on the opaque layer and forming a pattern of openings through the first layer of resist and through the opaque layer;
   toughening and de-sensitizing the first layer of resist so that the first layer of resist is substantially unaffected by subsequent processing steps;
   depositing a second layer of resist on the toughened first layer of resist and forming a second pattern of openings through the second layer of resist in alignment with every other opening of the first pattern of openings;
   forming phase shifting areas on the substrate using the second pattern of openings while the opaque layer is protected by the toughened first layer of resist; and stripping the toughened first layer of resist and the second layer of resist.

9. The method of forming a phase shifting mask as claimed in claim 8 and wherein forming the phase shifting areas is by etching the transparent substrate through the openings in the second layer of resist to form phase shifting areas in the transparent substrate.

10. The method of forming a phase shifting mask as claimed in claim 9 and wherein the phase shifting areas are etched in stages to one or more intermediate depths.

11. The method of forming a phase shifting mask as claimed in claim 10 and wherein the transparent substrate is cleaned after each etch stage while the toughened first layer of resist and second layer of resist remain in place.

12. The method of forming a phase shifting mask as claimed in claim 10 and wherein the second layer of resist is stripped away and another layer of resist is deposited and realigned for each etch stage.

13. The method of forming a phase shifting mask as claimed in claim 9 and wherein the first layer of resist is toughened and de-sensitized by a method selected from the group of methods consisting of plasma etching, reactive ion etching (RIE), oven baking at an elevated temperature, vacuum baking at an elevated temperature, and UV stabilization.

14. The method of forming a phase shifting mask as claimed in claim 9 and wherein a Levenson phase shifting mask is formed.

15. A method of forming a phase shifting mask comprising:

depositing an opaque layer on a transparent substrate;

depositing a first layer of resist on the opaque layer and forming a pattern of openings through the first layer of resist and through the opaque layer;

toughening and de-sensitizing the first layer of resist so that the first layer of resist is substantially unaffected by subsequent processing steps;

depositing a second layer of resist on the toughened first layer of resist with the second layer of resist having a pattern of phase shifting openings in alignment with every other opening in the toughened first layer of resist;

forming phase shifting areas on the substrate using the phase shifting openings in the second layer of resist while the opaque layer is protected by the toughened first layer of resist; and stripping the toughened first layer of resist and the second layer of resist.

16. A method of protecting an opaque layer of a phase shift mask during the fabrication thereof said method comprising:

providing a transparent with the opaque layer formed thereon;

depositing a first layer of resist on the opaque layer;

transferring a predetermined pattern onto the opaque layer using the first layer of resist;

toughening and de-sensitizing the first layer of resist to form a toughened layer of resist that is substantially unaffected subsequent processing steps; and forming phase shifting areas while the opaque layer is protected by the toughened first layer of resist.

17. The method of protecting an opaque layer as claimed in claim 16 and wherein forming phase shifting areas is by depositing a second layer of resist on the toughened first layer of resist and etching the phase shifting areas using the second layer of resist.

18. The method of protecting an opaque layer as claimed in claim 16 and wherein toughening and desensitizing the toughened first layer of resist is by a method selected from the group of methods consisting of plasma etching, reactive ion etching (RIE), oven baking at an elevated temperature, vacuum baking at an elevated temperature an UV stabilization.

* * * * *

UNITED STATES PATENT AND TRADEMARK OFFICE
CERTIFICATE OF CORRECTION

PATENT NO. : 5,376,483
DATED : December 27, 1994
INVENTOR(S) : J. Brett Rolfson It is certified that error appears in the above-identified patent and that said Letters Patent is hereby corrected as shown below:

Column 1, line 1, please insert:

--This invention was made with Government support under Contract No. MDA972-92-C-0054 awarded by Advanced Research Projects Agency (ARPA). The Government has certain rights in this invention.--

Signed and Sealed this

Sixteenth Day of May, 1995

*Attest:*

*Attesting Officer*

BRUCE LEHMAN

*Commissioner of Patents and Trademarks*

UNITED STATES PATENT AND TRADEMARK OFFICE
CERTIFICATE OF CORRECTION

PATENT NO. : 5,376,483
DATED : December 27, 1994
INVENTOR(S) : J. Brett Rolfson

It is certified that error appears in the above-identified patent and that said Letters Patent is hereby corrected as shown below:

Column 1,
After the title, insert:
-- GOVERNMENT RIGHTS
This invention was made with United States Government support under contract No. MDA972-92-C-0054 awarded by the Advanced Research Projects Agency (ARPA). The United States Government has certain rights in this invention. --

Signed and Sealed this

Sixth Day of November, 2001

Attest:

NICHOLAS P. GODICI
Attesting Officer   Acting Director of the United States Patent and Trademark Office